US010832886B2

(12) United States Patent
Ikegami et al.

(10) Patent No.: US 10,832,886 B2
(45) Date of Patent: Nov. 10, 2020

(54) BEAM IRRADIATION DEVICE

(71) Applicant: Hitachi High-Tech Corporation, Tokyo (JP)

(72) Inventors: Akira Ikegami, Tokyo (JP); Yuta Kawamoto, Tokyo (JP); Naomasa Suzuki, Tokyo (JP); Manabu Yano, Tokyo (JP); Yasushi Ebizuka, Tokyo (JP); Naoma Ban, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/291,090

(22) Filed: Mar. 4, 2019

(65) Prior Publication Data

US 2019/0287754 A1  Sep. 19, 2019

(30) Foreign Application Priority Data

Mar. 19, 2018  (JP) ................. 2018-050398

(51) Int. Cl.
*H01J 37/141* (2006.01)
*H01J 37/153* (2006.01)
(Continued)

(52) U.S. Cl.
CPC ............ *H01J 37/141* (2013.01); *H01J 37/09* (2013.01); *H01J 37/1474* (2013.01);
(Continued)

(58) Field of Classification Search
CPC ...... H01J 37/141; H01J 37/09; H01J 37/1474; H01J 37/153; H01J 37/28;
(Continued)

(56) References Cited

U.S. PATENT DOCUMENTS

| 9,653,256 B2 | 5/2017 | Ikegami et al. |
| 2004/0119022 A1* | 6/2004 | Sato ................ H01J 37/153 |
| | | 250/396 R |

(Continued)

FOREIGN PATENT DOCUMENTS

| JP | 5886663 B2 | 3/2016 |
| JP | 6178699 B2 | 8/2017 |

*Primary Examiner* — Nicole M Ippolito
*Assistant Examiner* — Sean M Luck
(74) *Attorney, Agent, or Firm* — Crowell & Moring LLP

(57) ABSTRACT

The present disclosure aims at proposing a multi-beam irradiation device capable of correcting off-axis aberrations. In order to achieve the above object, a beam irradiation device is proposed, which includes a beam source which emits a plurality of beams; an objective lens (17) which focuses a beam on a sample; a first lens (16) which is arranged such that a lens main surface is positioned at an object point of the objective lens and deflects a plurality of incident beams toward an intersection point of a lens main surface of the objective lens and an optical axis; a second lens (15) which is arranged closer to a beam source side than the first lens and focuses the plurality of beams on a lens main surface of the first lens; and a third lens (14) which is arranged closer to the beam source side than the second lens and deflects the plurality of beams toward an intersection point of a lens main surface of the second lens and the optical axis.

11 Claims, 14 Drawing Sheets

(51) Int. Cl.
*H01J 37/28* (2006.01)
*H01J 37/147* (2006.01)
*H01J 37/09* (2006.01)

(52) U.S. Cl.
CPC ............ *H01J 37/153* (2013.01); *H01J 37/28* (2013.01); *H01J 2237/0453* (2013.01); *H01J 2237/1405* (2013.01); *H01J 2237/1532* (2013.01)

(58) Field of Classification Search
CPC ....... H01J 2237/0453; H01J 2237/1405; H01J 2237/1532; H01J 2237/0435; H01J 2237/0635; H01J 2237/31774
See application file for complete search history.

(56) References Cited

U.S. PATENT DOCUMENTS

| | | | |
|---|---|---|---|
| 2011/0220795 A1* | 9/2011 | Frosien | H01J 37/244 250/307 |
| 2013/0248731 A1 | 9/2013 | Tanimoto et al. | |
| 2013/0299697 A1* | 11/2013 | Enyama | H01J 37/12 250/307 |
| 2015/0179399 A1* | 6/2015 | Kruit | H01J 37/14 250/307 |
| 2015/0279615 A1* | 10/2015 | Potocek | G02B 21/0016 250/307 |
| 2017/0133198 A1* | 5/2017 | Kruit | H01J 37/20 |

\* cited by examiner

BEAM IRRADIATION DEVICE

TECHNICAL FIELD

The present invention relates to a beam irradiation device, and particularly relates to a beam irradiation device irradiating a sample with a plurality of beams.

BACKGROUND ART

Since beams pass through an off-axis position from a central axis of a lens, off-axis aberration (astigmatism, field curvature, color, coma, and distortion) is generated in a multi-beam Scanning Electron Microscope (SEM) irradiating a sample with a plurality of beams. Spot diameters of respective beams are increased or acquired images are distorted due to the respective off-axis aberrations generated. As a method of suppressing an increase in the spot diameter due to the off-axis aberration, as shown in Patent Literature 1, it is possible to correct astigmatism and field curvature generated due to a plurality of beams passing through the outside of the axis by predicting the distribution of field curvature aberration generated due to off-axis aberration in advance, and forming a shape of an aperture lens array.

Further, Patent Literature 2 describes a technique of correcting a deflection aberration in conjunction with field of view (FOV) movement by beam deflection in a single-beam optical system.

PRIOR ART LITERATURE

Patent Literature

PTL 1: Japanese Patent No. 5886663 (corresponding to US Patent Application Publication US2013/0248731)

PTL 2: Japanese Patent No. 6178699 (corresponding to U.S. Pat. No. 9,653,256)

SUMMARY OF INVENTION

Technical Problem

Patent Literature 1 corrects an astigmatism curvature aberration by devising a shape of a multi-lens aperture with respect to an off-axis aberration generated in the multi-beam SEM. However, when changing an optical condition or changing an axis adjustment condition, it is necessary to apply a feedback to the shape of the aperture and an applying voltage condition applied to an aperture lens, and it is necessary to reassemble and adjust the optical condition.

On the other hand, if a high-speed FOV movement can be performed by the multi-beam SEM, further high-speed measurement and inspection can be performed by a combination of measurement and inspection of a plurality of points by multiple beams and the high-speed FOV movement. However, if a deflection aberration generated at that time cannot be eliminated, high-accuracy measurement and inspection cannot be realized. According to the technique disclosed in Patent Literature 2, it is possible to suppress the aberration in a single beam. However, it is difficult to correct the off-axis aberration generated when the multiple beams pass through the outside of the axis of the lens with only the technique disclosed in Patent Literature 2.

Hereinafter, a beam irradiation device aiming at correcting an off-axis aberration generated when beams pass through the outside of an axis of a lens, such as beam deflection in a FOV movement, in a multi-beam beam irradiation device will be described.

Solution to Problem

As an aspect of the invention aiming at achieving the above object, a beam irradiation device is proposed, which includes a beam source which emits a plurality of beams; an objective lens which focuses a beam on a sample; a first lens which is arranged such that a lens main surface is positioned at an object point of the objective lens and deflects a plurality of incident beams toward an intersection point of a lens main surface of the objective lens and an optical axis; a second lens which is arranged closer to a beam source side than the first lens and focuses the plurality of beams on a lens main surface of the first lens; and a third lens which is arranged closer to the beam source side than the second lens and deflects the plurality of beams toward an intersection point of a lens main surface of the second lens and the optical axis.

Advantageous Effect

According to the above configuration, it is possible to correct the off-axis aberration by the multi-beam beam irradiation device.

DESCRIPTION OF EMBODIMENTS

Figure 1:
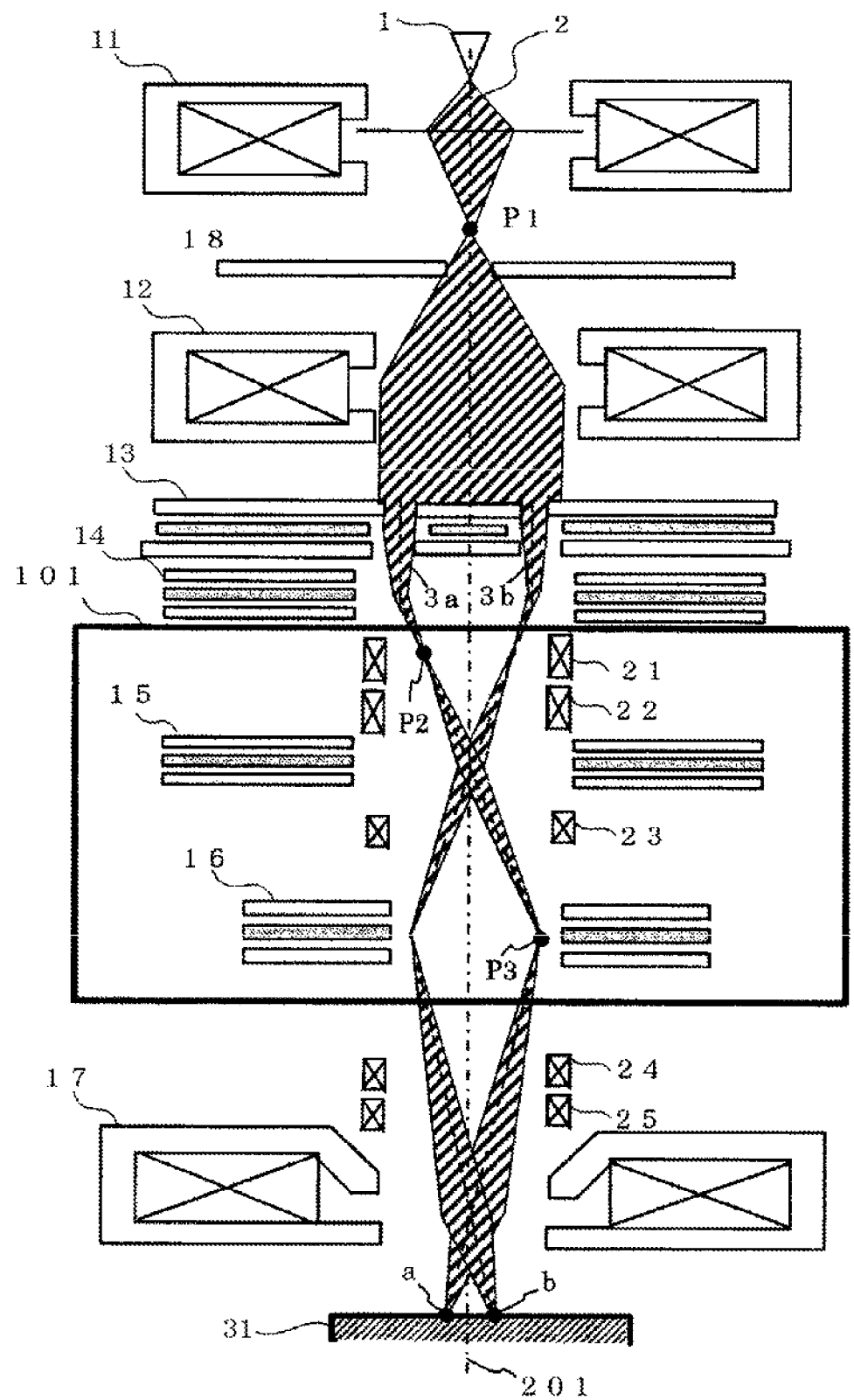
FIG. 1 is a diagram illustrating an example of a multi-beam irradiation device (a first embodiment).

For measurement and inspection of a fine semiconductor device pattern, there is a charged-particle beam device such as a scanning electron microscope. The scanning electron microscope is a device for performing the measurement and inspection using an image obtained by scanning a focused electron beam on a sample. With the complexity and miniaturization of recent semiconductor devices, demands for more measurement and inspection in a short period of time are intensified.

In order to improve the speed of the measurement and inspection, it is effective to shorten an imaging time and a movement time of an inspection Field Of View (FOV). In order to shorten the imaging time, it is possible to acquire an SEM image of high S/N with a short imaging time by increasing a probe current. When the imaging time is shortened by the above method, a beam staying time per pixel at the time of acquiring the SEM image becomes short. When the beam staying time becomes shorter than a response time of a detector, information when a previous pixel is irradiated with the electrons coexists in a next pixel.

As described above, even if the probe current is increased, there is a limit to the response time of the detector, and there is a limit to the shortening of the imaging time. As a method of breaking through the limit, it is conceivable to adopt a multi-beam SEM which simultaneously irradiates a sample with a plurality of beams, discriminates signal electrons generated by respective beam irradiation, and detects the signal electrons simultaneously by a plurality of detectors.

Since simultaneous observation using the plurality of beams is possible in the multi-beam SEM, improvement in the speed of the measurement and inspection can be expected. However, in order to further speed-up, by deflecting the beams by deflectors, it is desirable to jointly use a FOV movement that does not require a stage movement. However, unless it is possible to suppress an off-axis aberration generated when the plurality of beams pass through the outside of an axis of a lens, a high-accuracy measurement and inspection cannot be expected.

With respect to an off-axis chromatic aberration, an off-axis coma aberration, and an off-axis distortion aberration, although a correction method is conceivable by using a double lens, an objective lens is longer-focused and a resolution is relatively lowered since a lens equivalent to an objective lens is arranged.

In the following embodiments, a beam irradiation device that performs an off-axis aberration correction generated during beam deflection of the FOV movement in a multi-beam beam irradiation device will be described.

In the following embodiments, a beam irradiation device including a multi-beam optical system which irradiates a sample with two or more beams is described. For example, a beam irradiation device is proposed, which includes an electron source which emits a plurality of beams; an objective lens which focuses beams on the sample; a first lens which is arranged such that a lens main surface of the first lens is positioned at an object point of the objective lens and deflects a plurality of incident beams toward an intersection point of a lens main surface of the objective lens and an optical axis; a second lens which is arranged closer to an electron source side than the first lens and focuses the plurality of beams on the lens main surface of the first lens; and a third lens which is arranged closer to the electron source side than the second lens and deflects the plurality of beams toward an intersection point of a lens main surface of the second lens and the optical axis.

According to the above configuration, for example, providing a deflection aberration corrector makes it possible to provide a multi-beam device. As a result, since it becomes possible to electrically move the FOV by the beam deflection using the deflection aberration corrector after dividing the FOV with the plurality of beams and imaging at a high speed, measurement and inspection at high speed with high accuracy can be realized.

First Embodiment

FIG. 1 is a diagram illustrating an outline of the multi-beam SEM. Primary electrons 2 emitted from an electron source 1 (a chip) are converged to P1 by a lens action of a first condenser lens 11. Thereafter, the electrons pass through a diaphragm 18, and the primary electrons 2 converged at P1 are changed into parallel beams by a lens action of a second condenser lens 12. The parallel primary electrons 2 are divided by an aperture lens array 13. Since the primary electrons divided by the aperture lens 13 reach the sample as the plurality of beams, an optical element from the electron source 1 to the aperture lens array 13 becomes a beam source emitting the plurality of beams.

Divided primary electrons 3a, 3b are subjected to a lens action of the aperture lens array 13 and a lens action of a divided beam focusing lens 14, and the divided primary electrons 3a, 3b are respectively focused to P2.

The focused primary electrons rush into a deflection aberration corrector 101 including deflectors 21, 22, and 23, an aberration generating lens 15, and a color dispersion trajectory focusing lens 16. Further, a central trajectory of each of the divided primary electrons 3a, 3b is focused on a lens main surface of the aberration generating lens 15 in the deflection aberration corrector 101 by the lens action of the divided beam focusing lens 14.

Further, after the beams are divided, the trajectories focused at P2 appear to have been emitted from P2 at different inclination angles. The trajectories are referred to as trajectories with different opening angles afterwards. The trajectories with different opening angles are focused on a crossover P3 formed on a lens main surface of the color dispersion focusing lens 16 in the deflection aberration corrector 101. After passing through the deflection aberration corrector 101, the central trajectories of the divided beams 3a, 3b cross an optical axis in the vicinity of a main surface of an objective lens 17 and arrive at different points a, b of a wafer 31. In this case, the trajectories focused on P3 with different opening angles are refocused on the sample to form small spots in a nanometer order.

Although not illustrated, the scanning electron microscope illustrated in FIG. 1 is provided with a plurality of detectors corresponding to each beam, a scanning deflector for scanning each beam on the sample one-dimensionally or two-dimensionally, and an arithmetic unit which generates an image and a signal profile based on an output of each detector. Further, a control device for setting a lens condition and a deflector condition as will be described later is provided. Further, by providing a plurality of electron sources 1, the plurality of beams may be emitted. The beam source emitting the plurality of beams is not limited to the configuration exemplified in FIG. 1, and various forms can be adopted.

The optical system may simultaneously correct an off-axis aberration generated due to the primary electrons divided by the multi-lens array 13 which passes through the outside of the axis of the lens and a deflection aberration generated when the FOV is moved by the beam deflection.

Figure 2:
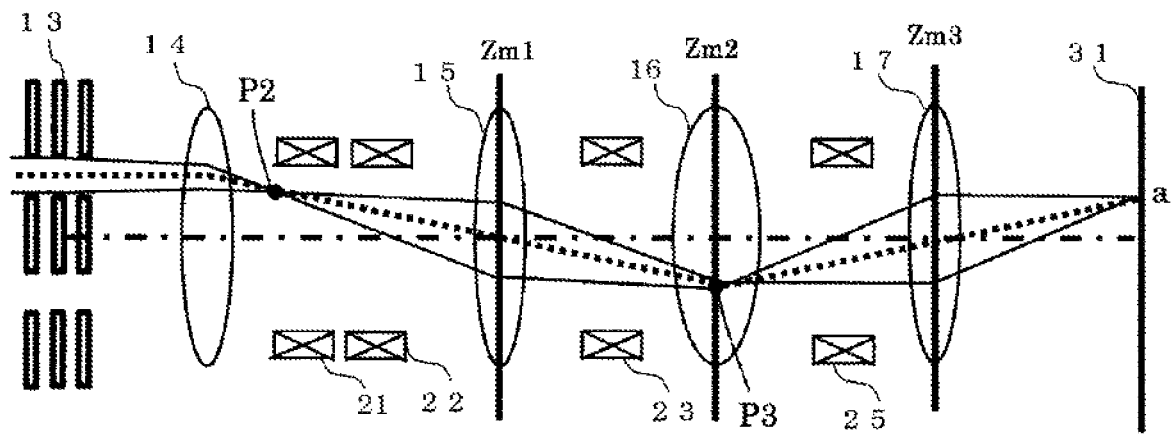
FIG. 2 is an explanatory diagram of trajectories of divided primary electrons (the first embodiment).

Next, a reason why the off-axis aberration and the deflection aberration can be corrected by the optical system as exemplified in FIG. 1 will be described with reference to FIG. 2 and the like. In order to facilitate the description, a symmetry plane Zm is defined as illustrated in FIG. 2. In a case where the trajectories with different opening angles are symmetric (anti-symmetric) with respect to the symmetry plane Zm, the off-axis aberration or the deflection aberration can be corrected by making an off-axis trajectory or a deflection trajectory anti-symmetric (symmetric).

It is to be noted that the "symmetric" can also be represented as, for example, mirror symmetry with a symmetry plane Zm2 as a mirror surface, and the "anti-symmetric" can also be represented as, for example, point symmetry with an intersection point of the symmetry plane Zm2 and the beams as a symmetric point.

Figure 3:
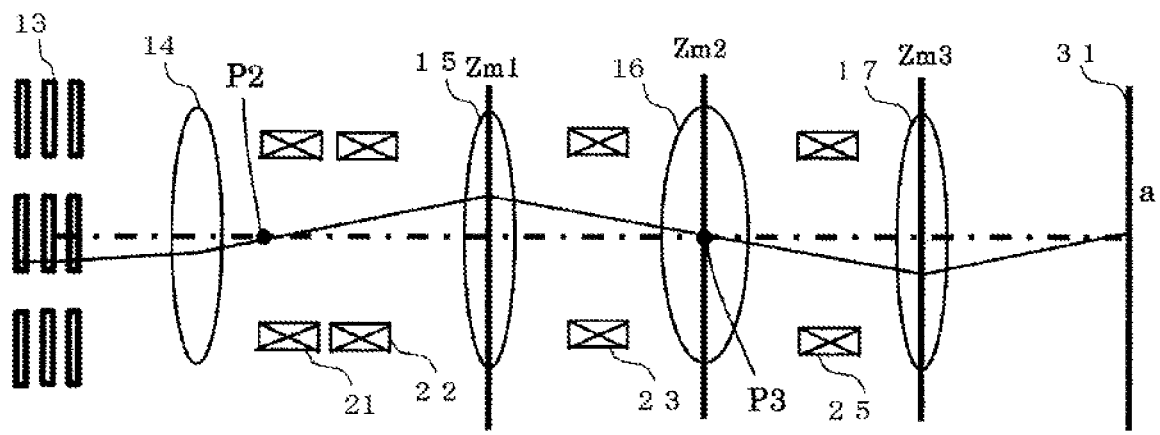
FIG. 3 is an explanatory diagram of a trajectory of a primary electron with different opening angles (the first embodiment).
Figure 4:
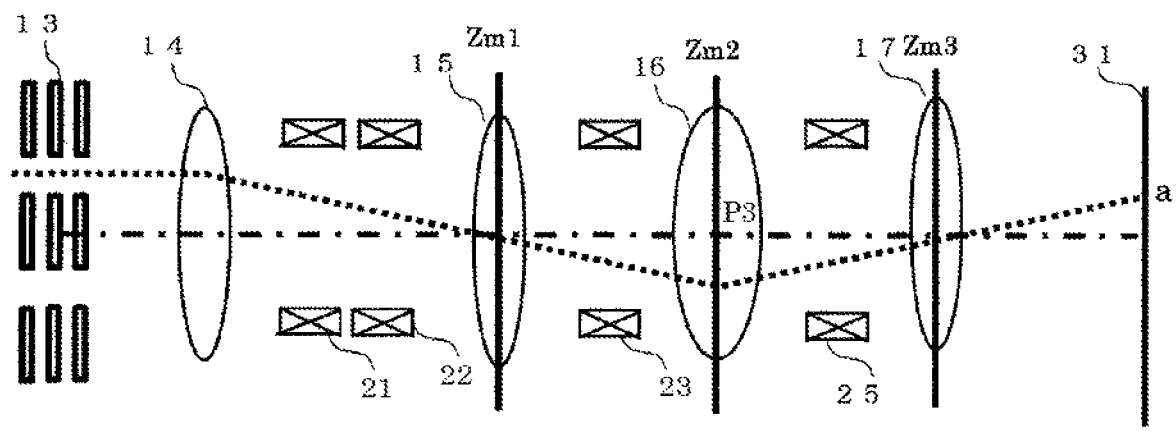
FIG. 4 is an explanatory diagram of a central trajectory of the divided primary electrons (the first embodiment).

The optical system according to the present embodiment performs the aberration correction by satisfying the above-described conditions. FIGS. 2 to 7 are diagrams illustrating a principle of the aberration correction. FIG. 3 is a diagram illustrating the trajectory with different opening angles (trajectory of the beams when only a focusing state (opening angles) of the beams is extracted) after passing through the aperture lens array 13. FIG. 4 is a diagram illustrating the central trajectory of the primary electrons divided by the aperture lens array 13. FIG. 2 is a diagram illustrating the trajectories of beams with an opening angle as illustrated in FIG. 3 after passing through the trajectory in FIG. 4.

After passing through the aperture lens array 13, the trajectories with different opening angles (FIG. 3) are focused on P2 by the lens 14. Thereafter, the beams pass through the lenses 15, 17 and are focused on the main surface P3 of the lens 16 and the wafer 31. Here, main surfaces of the lenses 15, 16, and 17 are defined as symmetry planes Zm1, Zm2, and Zm3.

Here, in the trajectories with different opening angles (FIG. 3), when Zm1 and Zm3 are the symmetry planes, the trajectories before and after passing through the symmetry planes are symmetric; when Zm2 is the symmetry plane, an arrangement condition and a focusing condition of the lens are determined such that the trajectories before and after passing through the symmetry plane are anti-symmetric.

On the other hand, after passing through the aperture lens array 13, the central trajectory of the divided beams (FIG. 4) is focused (deflected toward an intersection point of the main surface of the lens 15 and an ideal optical axis) on the main surface of the lens 15 (symmetry plane Zm1) by the lens 14. Thereafter, the central trajectory passes through the lens 16 and is refocused on the main surface (symmetry plane Zm3) of the objective lens 17 by a deflection action of the lens 16 and arrives at the off-axis point a on the wafer. The central trajectory of the divided beams is symmetrically arranged with respect to the symmetry planes Zm1 and Zm3, and anti-symmetrically arranged with respect to the symmetry plane Zm2.

With respect to each symmetry plane (Zm1, Zm2, and Zm3) as described above, a relationship of symmetry and anti-symmetry of the trajectory with different opening angles (trajectory illustrating the opening angles of the beams, FIG. 3) and the central trajectory of the beams (FIG. 4) is reversed. As a result, the off-axis aberration generated between the lenses 15, 17 is corrected to be zero by the symmetry of the above-mentioned trajectory. Although the off-axis chromatic aberration generated by the lens 14 in the optical system illustrated in the present embodiment cannot be corrected, it can be reduced by increasing a reduction ratio of the objective lens. Further, if the trajectory after P2 is finely adjusted, it is possible to cancel the off-axis chromatic aberration generated in the lens 14 eventually.

In order to enable the beam condition as described above, in the present embodiment, the plurality of beams are deflected toward the intersection point of the lens main surface (Zm1) of the lens 15 (aberration generating lens; second lens) and the ideal axis (lens center) by using the lens 14 (beam focusing lens: third lens) and are focused on the lens main surface (P2) of the lens 16 (color dispersion trajectory focusing lens: first lens). The aberration generating lens 15 focuses the beams on the lens main surface (Zm2) of the lens 16, and the lens 16 deflects the beams toward the intersection point of the main surface of the objective lens 17 and the ideal axis. Further, in the optical system of the present embodiment, the lens 15 and the objective lens 17 are arranged at symmetric positions in which Zm2 is the symmetry plane in the optical axis direction, and an object point of the objective lens 17 and a position of the lens main surface of the lens 16 are arranged to coincide with each other.

Figure 5:
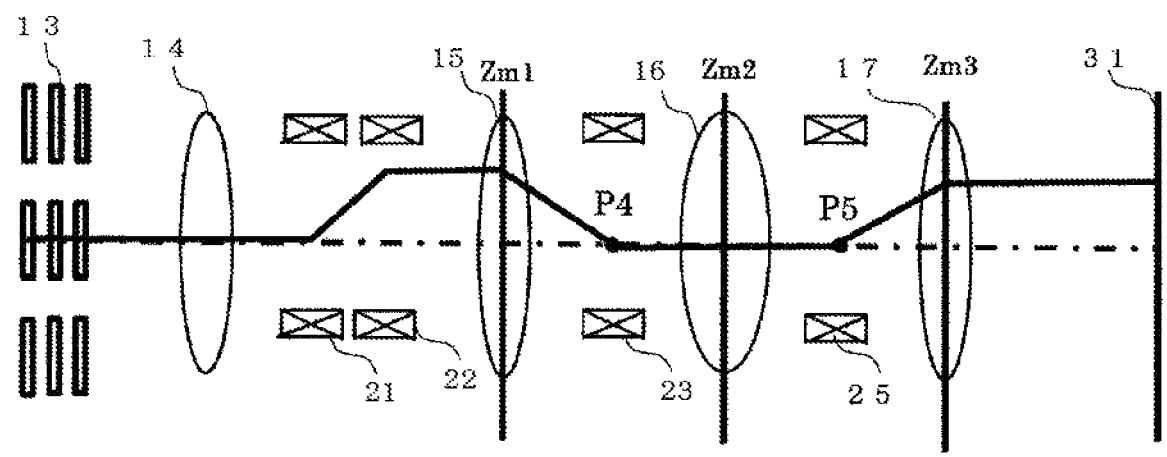
FIG. 5 is an explanatory diagram of a deflection trajectory when a Field Of View (FOV) is moved by deflection (the first embodiment).

FIG. 5 illustrates a deflection trajectory when the FOV is moved using deflectors. By adding the trajectory (FIG. 5) to the trajectory illustrated in FIG. 2, the trajectory (paraxial trajectory) when the FOV is moved by deflecting the divided primary electrons can be represented. Then, while maintaining the beam condition as illustrated in FIG. 2, by performing the FOV movement (supplying a FOV movement amount, a current corresponding to a FOV movement direction, or a voltage to the deflectors for the FOV movement), it becomes possible to perform the FOV movement while correcting the off-axis aberration in the multi-beam device.

FIG. 5 is a diagram illustrating the trajectory of the beams when it is assumed that the optical axis is irradiated with the beams. The primary electrons at the time of the FOV movement pass through the outside of the axis of the lens 15 by the deflectors 21, 22, and arrive at a focal point P4 of the lens 15. The primary electrons are swung back on the optical axis by the deflector 23 provided at the focal point position P4 and pass through the lens 16. Here, the main surface of the lens 16 is defined as a symmetry plane Zm2. The beams passing through the lens 16 are swung back from the outside of the axis by the deflector 25 provided on a front focal point position P5 of the lens 17. Thereafter, the beams are subjected to a lens action of the objective lens 17 and is vertically incident on the wafer 31.

Figure 6:
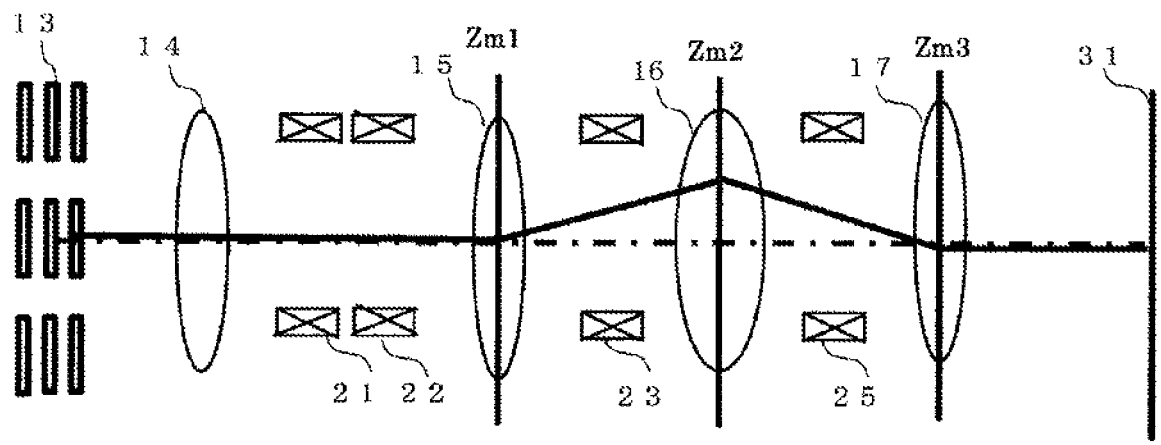
FIG. 6 is an explanatory diagram of a color dispersion trajectory generated by the deflection (the first embodiment).

FIG. 6 illustrates a chromatic dispersion trajectory generated when the deflection trajectory passes through the outside of the axis of the lens 15. Since the trajectory passes through the outside of the axis of the lens 15 by the deflector, chromatic dispersion is generated and the trajectory is off-axis. Thereafter, the trajectory is swung back by the lens action of the lens 16. When passing through the objective lens 17, the deflection trajectory passes through the objective lens in a manner of off-axis. At this time, the chromatic dispersion generated by the objective lens 17 and the chromatic dispersion generated by the lens 15 offset each other and the trajectory arrives at the wafer 31.

The paraxial trajectory in the optical system is represented by a sum of the trajectory with different opening angles (FIG. 3), the central trajectory of the divided beams (FIG. 4), and the deflection trajectory (FIG. 5).

Figure 7:
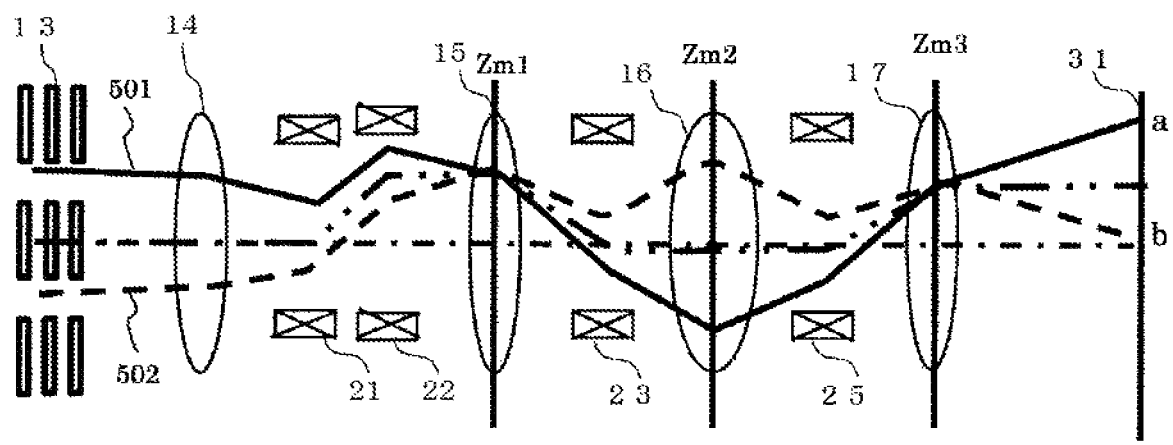
FIG. 7 is a diagram illustrating a trajectory obtained by adding the central trajectory of the divided primary electrons and the deflection trajectory (the first embodiment).

As an example, FIG. 7 illustrates a sum of the central trajectory of the divided beams and the deflection trajectory. A beam trajectory 501 in FIG. 7 illustrates a path that passes through an opening on a right side of the drawing (an opening of the aperture lens 13) and arrives at the point a of the wafer 31, and a beam trajectory 502 illustrates a path that passes through an opening on a left side of the drawing and arrives at the point b of the wafer 31. Both the beam trajectories 501, 502 are deflected as shown in FIG. 5, so that both the points a, b are shifted to the right side of the drawing as compared with a case where the beams are not subjected to deflection. Here, the trajectories with different opening angles are anti-symmetric with respect to the symmetry plane Zm2, and the central trajectory of the divided beams (FIG. 4) and the deflection trajectory (FIG. 5) are symmetric with respect to Zm2.

From the above symmetry, a lowest order deflection/off-axis aberration (deflection chromatic aberration, deflection coma aberration, off-axis chromatic aberration, and off-axis coma aberration) generated between P2 and Zm2 and the same aberration generated between Zm2 and the wafer 31 are equal in amount and different in sign and the same aberration is corrected simultaneously. The chromatic dispersion trajectory (FIG. 6) generated by the beam deflection is also symmetric with respect to Zm. As a result, it is possible to simultaneously correct a combined aberration (high-order chromatic aberration) of the same chromatic dispersion trajectories and each lens field. By using the configuration illustrated in the present embodiment, it is possible to realize the optical system that does not degrade the resolution due to the off-axis aberration and the deflection aberration even when the plurality of beams are simultaneously deflected.

Second Embodiment

Figure 8:
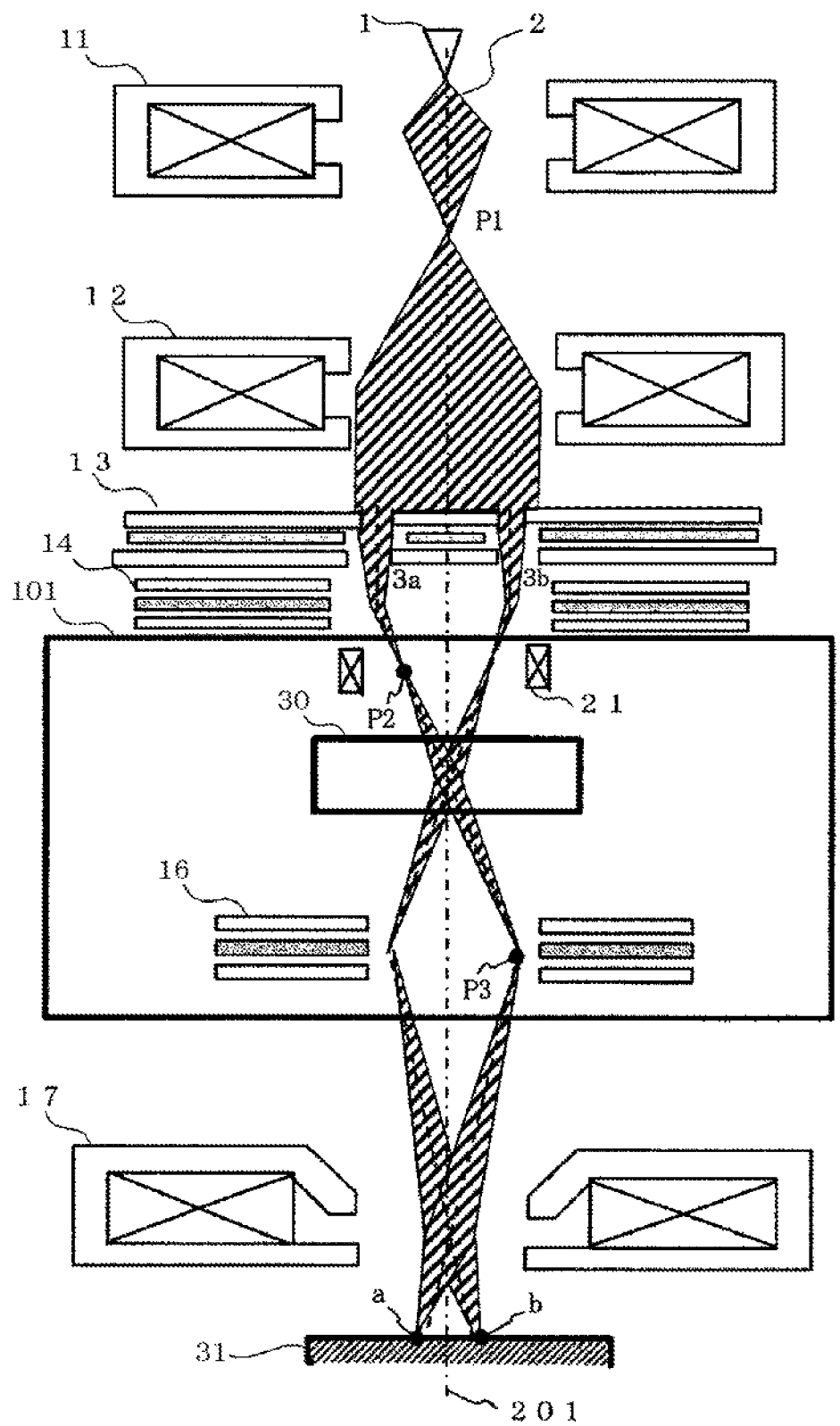
FIG. 8 is a diagram illustrating an example of a multi-beam irradiation device (a second embodiment).

A case where a Wien filter 30 for generating aberration is used instead of the lens 15 (aberration generating lens) exemplified in FIG. 1 will be described. FIG. 8 is an explanatory diagram illustrating the optical system according to the present embodiment. A shape of the Wien filter 30 is illustrated in FIG. 9.

Figure 9:
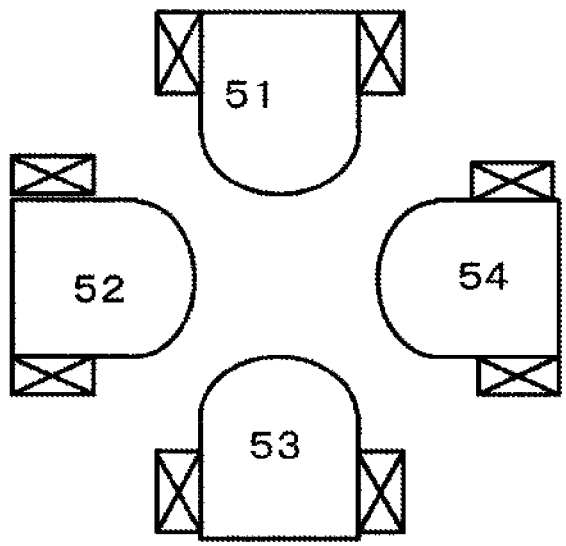
FIG. 9 is a diagram illustrating a Wien filter for generating aberration.

FIG. 9 is a schematic diagram of the Wien filter projected on a section perpendicular to an optical axis 201. As illustrated in FIG. 9, the Wien filter 30 is formed of four electromagnetic poles 51, 52, 53, and 54. A coil is wound around each electromagnetic pole, by applying a voltage and a current to an electrode and the coil of each electromagnetic pole, it is possible to generate electrostatic fields E1, E2 and static magnetic fields B1, B2. Here, E1 (B1) is an electric (magnetic) dipole field and E2 (B2) is an electric (magnetic) quadrupole field. During Wien filter operation, a field is generated such that E1, B1 are orthogonal in a plane perpendicular to the optical axis.

Figure 10:
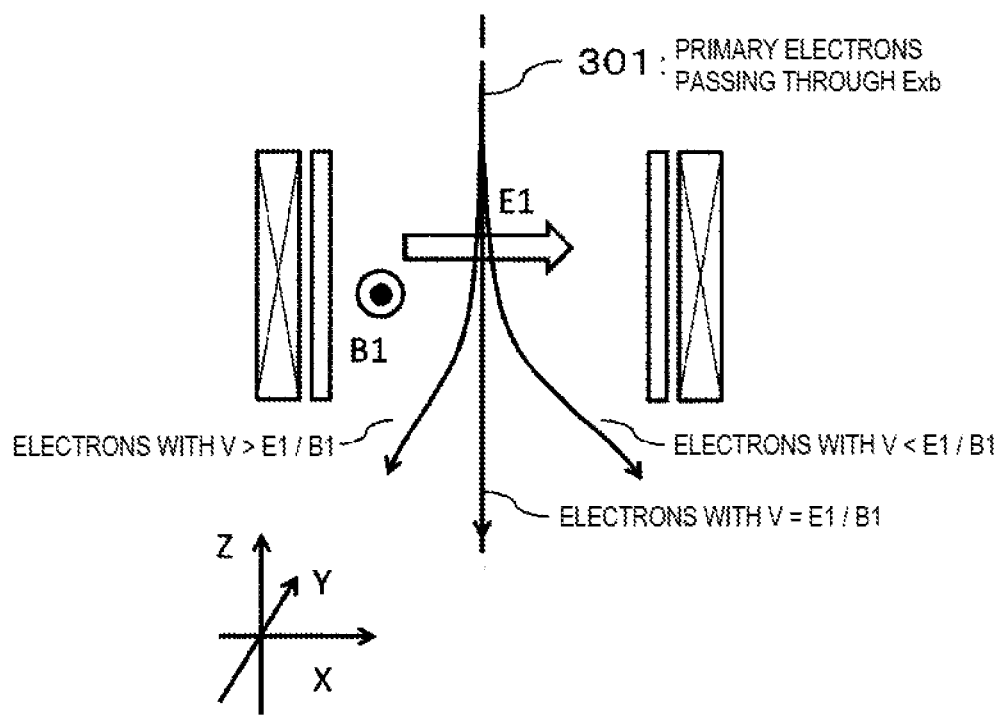
FIG. 10 is a cross-sectional view of the Wien filter for generating aberration.
Figure 11:
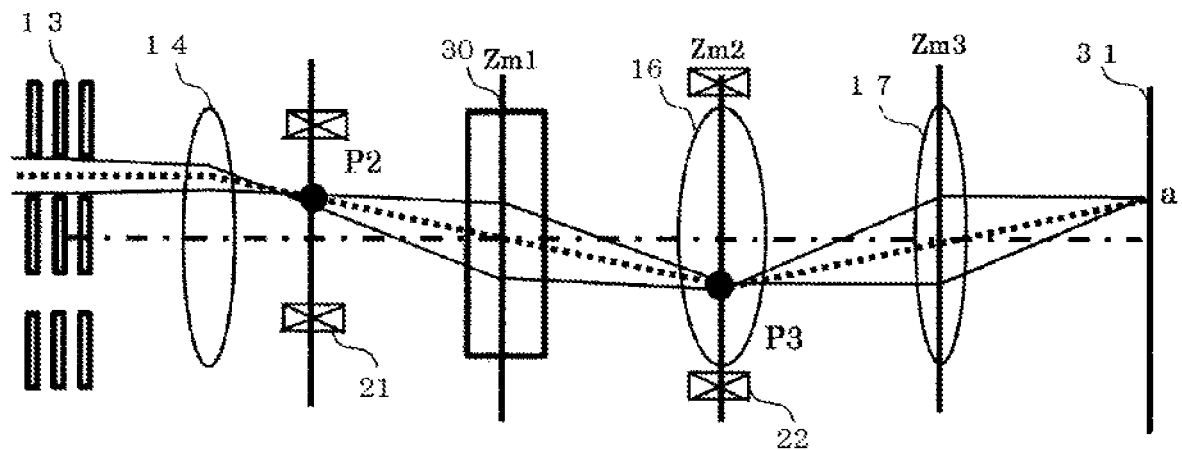
FIG. 11 is an explanatory diagram of trajectories of divided primary electrons (a second embodiment).
Figure 12:
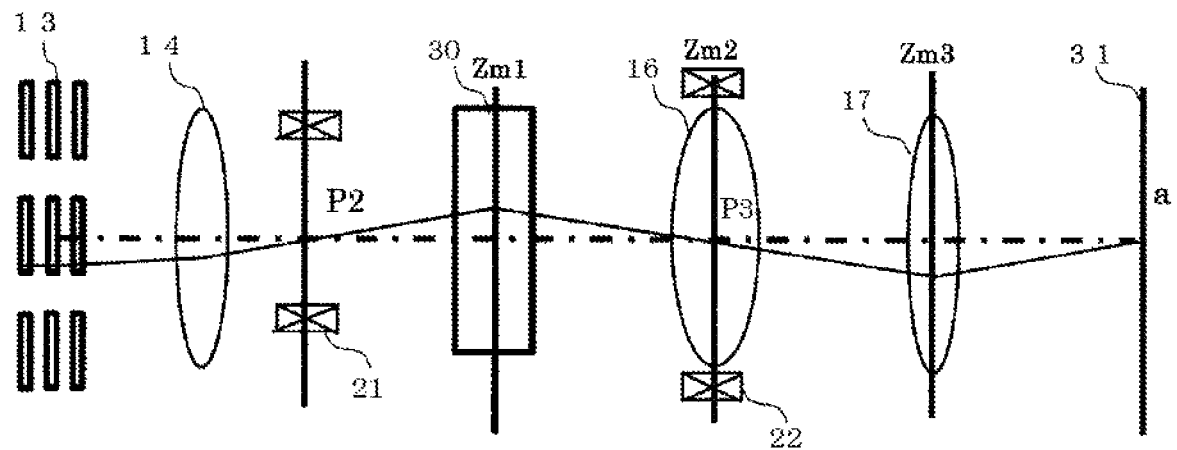
FIG. 12 is an explanatory diagram of a trajectory of a primary electron with different opening angles (the second embodiment).
Figure 13:
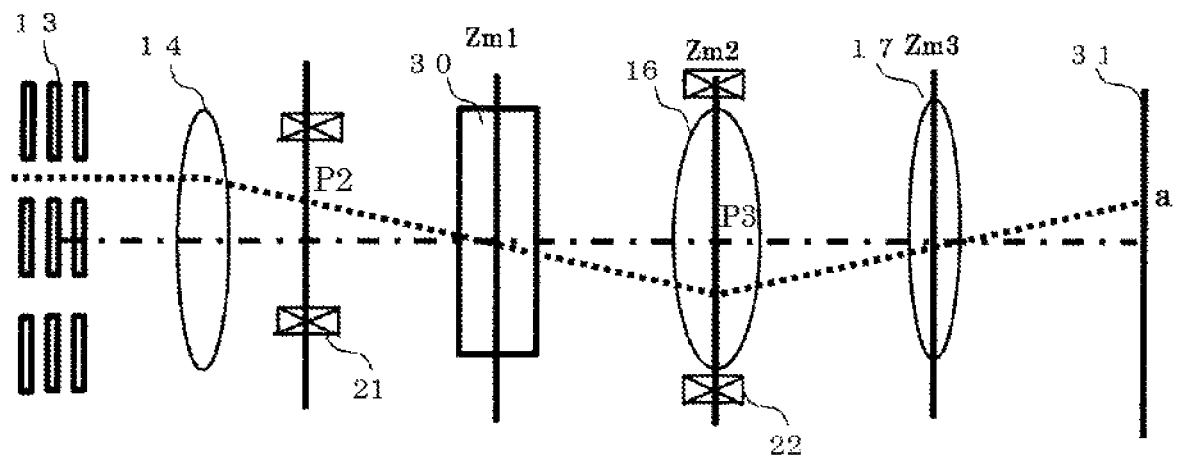
FIG. 13 is an explanatory diagram of a central trajectory of the divided primary electrons (the second embodiment).
Figure 14:
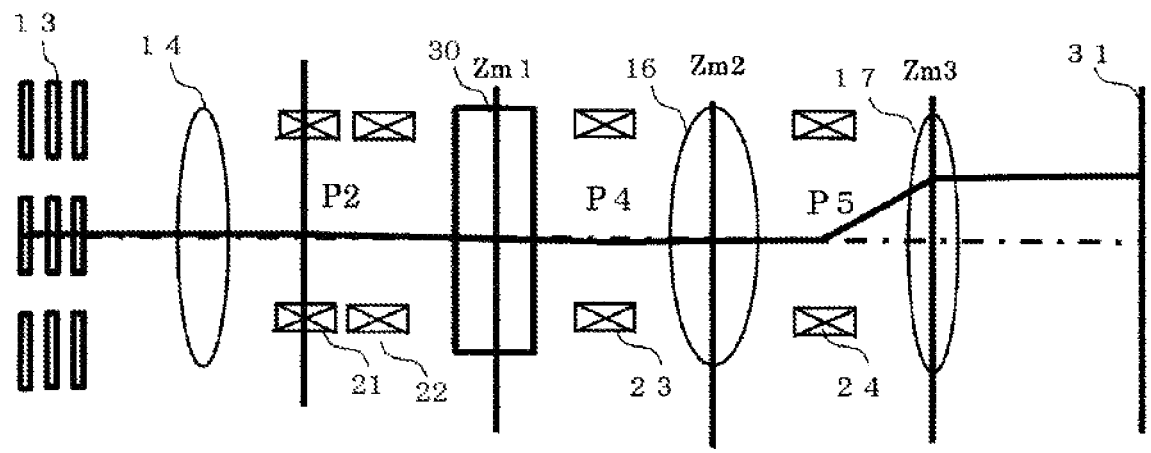
FIG. 14 is an explanatory diagram of a deflection trajectory when a FOV is moved by deflection (the second embodiment).

The present embodiment illustrates a case where the electric field E1 is taken in an X-axis direction and the magnetic field B1 is taken in a Y-axis direction. FIG. 10 is a diagram of a state where a primary electron 301 passes through the generated electromagnetic fields (E1, B1) when viewed from a direction orthogonal to the beam optical axis. A speed of the primary electrons 301 is set as V. A condition under which the divided primary electrons 301 go straight through the Wien filter is given by Equation 1.

[Equation 1]

$$v = E_1(z)/B_1(z) \quad (1)$$

Here, when energy of the primary electrons 301 is low (v<E1/B1), the primary electrons 301 are bent to a direction of the electric field E1 due to a received deflection action, and are bent to an opposite direction when the energy of the primary electrons 301 is high (v>E1/B1).

As a result, dispersion is generated in the Wien filter. Further, at the same time, a lens action is generated in the electric field (X-axis). By the lens action generated in the X-axis direction, a component spreading in the direction of the electric field (X-axis) is subjected to a focusing action, and a component spreading in the direction of the magnetic field (Y-axis) goes straight. As a result, a focusing point in the X-axis direction and a focusing point in the Y-axis direction can be located at different positions. A difference between the focusing point in the X direction and the focusing point in the Y direction thus generated can be corrected by superimposing the quadrupole field. The Wien filter is also a kind of lens, and a quadrupole field intensity given to correct a deviation between the X-direction focusing point and the Y-direction focusing point generated by the lens action is represented by Equation 2.

[Equation 2]

$$\frac{E_2(z)}{E_1(z)} - \frac{B_2(z)}{B_1(z)} = -\frac{eB_1^2}{2mE_1} \quad (2)$$

Here, e is an elementary charge and m is electron mass. A condition for making the chromatic aberration generated by adding the quadrupole field given by Equation 2 zero is considered.

In the present embodiment, the deflection chromatic aberration generated at the time of the FOV movement due to the deflection is corrected by using the chromatic dispersion generated by the Wien filter 30. In order to generate the dispersion only by the Wien filter 30, it is necessary to make the chromatic aberration generated from the electromagnetic quadrupole field given by Equation 2 zero. A condition that the chromatic aberration generated from the electromagnetic quadrupole field becomes zero is illustrated in Equation 3.

[Equation 3]

$$\frac{E_2(z)}{\phi_0} = \sqrt{\frac{e}{2m\phi_0}} B_2(z) \quad (3)$$

$\Phi_0$ is an accelerating voltage of the beams. Equation 1 is the condition that the primary electrons 301 at a specific speed go straight into the Wien filter; Equation 2 is the condition of the quadrupole field intensity (E2, B2) applied for correcting the deviation between the X-direction focusing point and the Y-direction focusing point generated by adding the dipole fields C1, B1 to the Wien filter; and Equation 3 is a relational expression between the electric quadrupole field E2 and the magnetic quadrupole field B2 for making the chromatic aberration generated when the quadrupole field is added zero.

The electromagnetic field superimposed on the Wien filter 30 in the aberration correction unit 101 is set to satisfy the Equations 1, 2, and 3 such that the beams in both the X direction and the Y direction are focused on the point P3.

FIGS. 11 to 16 illustrate ray diagrams when operating under the above operating conditions. In these drawings, the aberration generating lens 15 in FIGS. 2 to 7 is replaced with the Wien filter 30. As is clear when comparing FIG. 5 with FIG. 14, by replacing the rotationally symmetric lens 15 with the Wien filter, an off-axis of the deflection trajectory at a main surface position of the lens 15 disappears. In the optical system exemplified in FIG. 5, the trajectory of the beams between the lenses 15, 17 is made mirror-symmetric with Zm2 as the symmetry plane so that the chromatic dispersion generated in the two lenses offsets each other; whereas the Wien filter can generate chromatic dispersion that offsets the chromatic dispersion generated by the lens 17 in the beams passing through the optical axis.

In the present embodiment, it is possible to focus the trajectories with different opening angles focused at P2 to P3 by the lens action generated by satisfying the focusing condition (equation 2) in two directions of the Wien filter.

Third Embodiment

Figure 17:
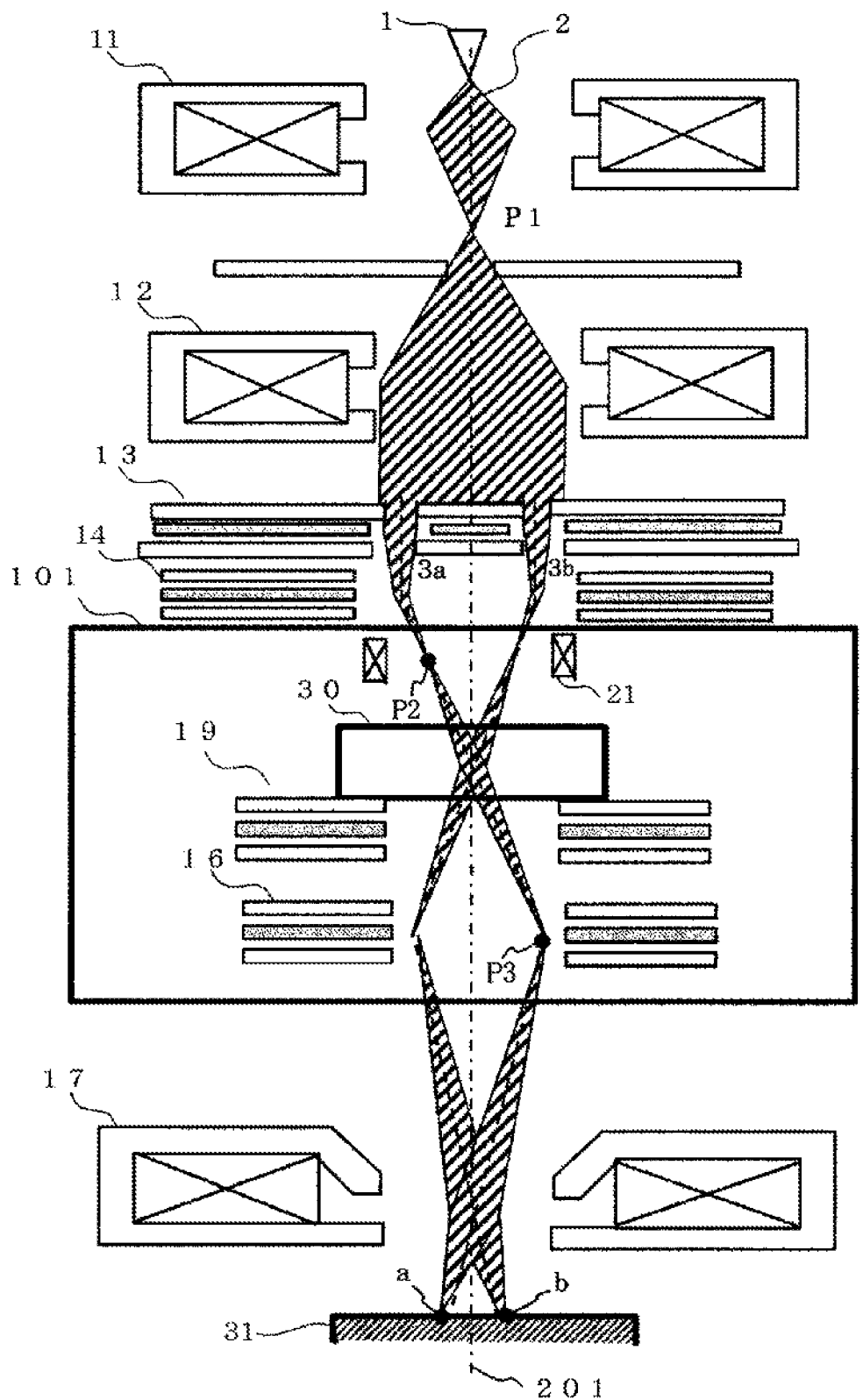
FIG. 17 is a diagram illustrating an example of a multi-beam irradiation device (a third embodiment).

As exemplified in FIG. 17, a rotationally symmetric lens 18 may be added to either an electron source side or a sample side of the Wien filter 30 in FIG. 8. By adopting such a lens, it is possible to assist the focusing action of the Wien filter. Since the lens is for assisting the focusing action of the Wien filter, the lens is controlled in conjunction with the Wien filter.

Fourth Embodiment

Figure 15:
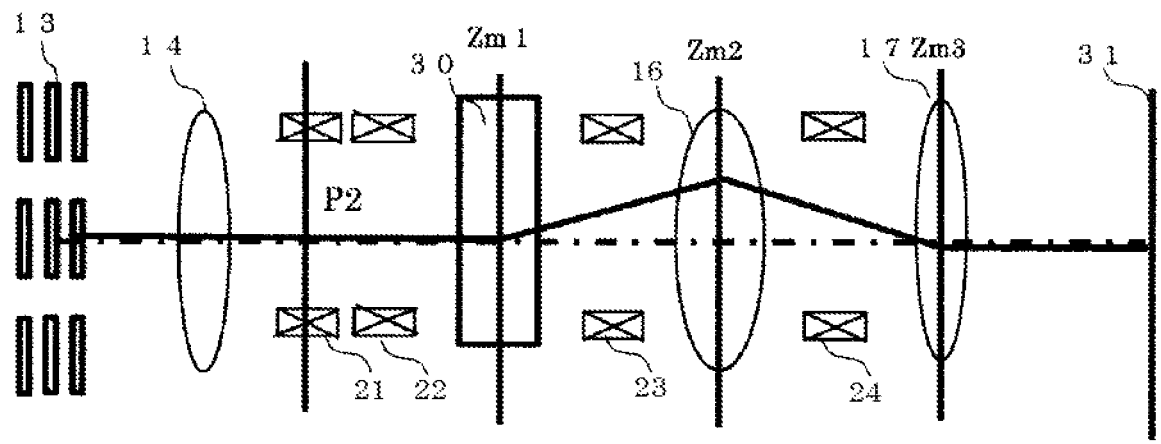
FIG. 15 is an explanatory diagram of a color dispersion trajectory generated by the deflection (the second embodiment).
Figure 16:
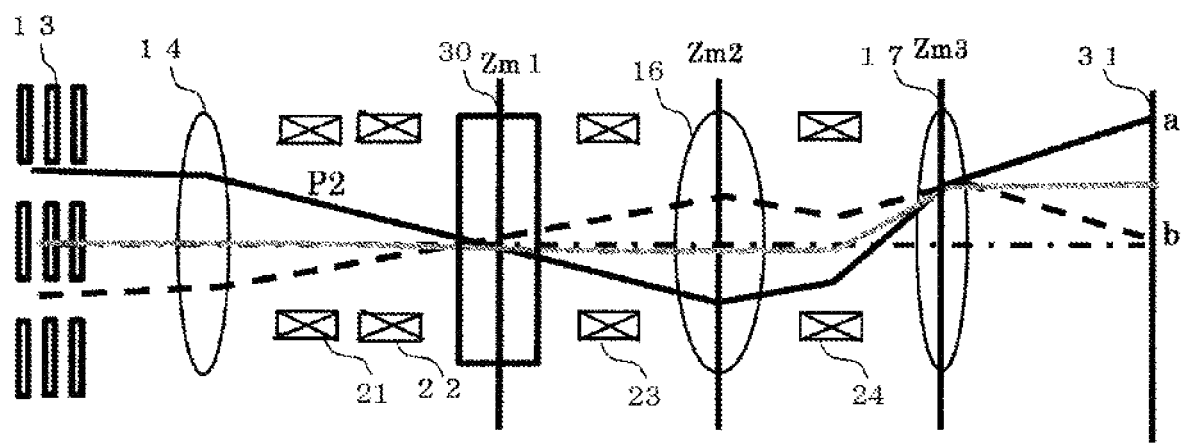
FIG. 16 is a diagram illustrating a trajectory obtained by adding the central trajectory of the divided primary electrons and the deflection trajectory (the second embodiment).
Figure 18:
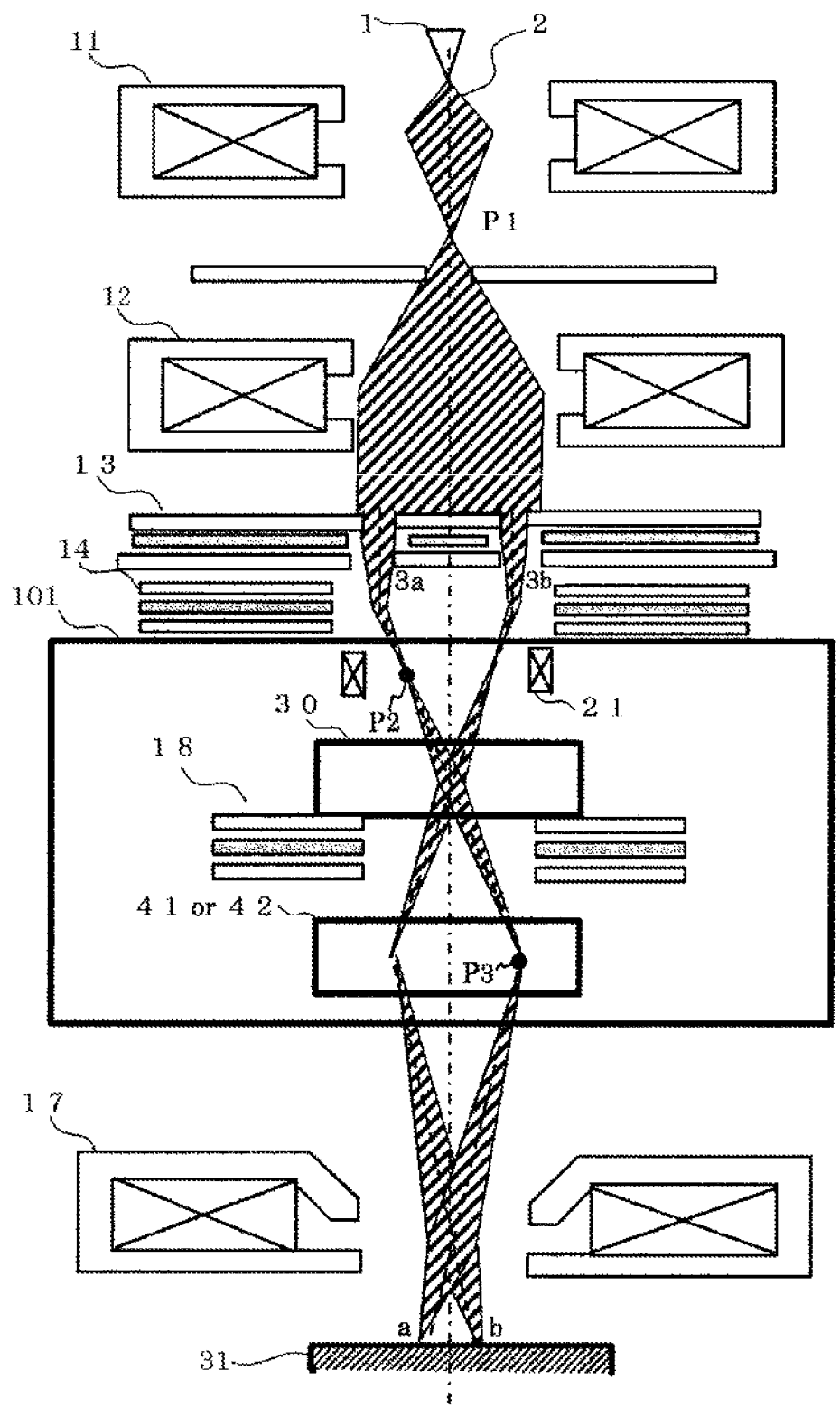
FIG. 18 is a diagram illustrating an example of a multi-beam irradiation device (a fourth embodiment).

As exemplified in FIGS. 6 and 15, in the above embodiments, although a high-order chromatic aberration suppressing lens 16 for focusing the chromatic dispersion trajectory generated by the aberration generating lens 15 or the Wien filter 30 on the main surface of the objective lens 17 is adopted, as exemplified in FIG. 18, an electromagnetic dipole 41 or an electromagnetic quadrupole 42 can also be adopted instead of the high-order chromatic aberration suppressing lens 16. (For example, see U.S. Pat. No. 9,704,687 for the electromagnetic dipole and the electromagnetic quadrupole).

Fifth Embodiment

When a beam is deflected to move the FOV, the beams pass through the outside of the axis of the objective lens 17. At this time, astigmatism and a field curvature aberration are generated. The field curvature can be corrected by changing a lens intensity of the objective lens 17; however, in order to correct the astigmatism, it is desirable to arrange an optical element (stigma coil) which generates a quadrupole field at a position where the trajectories having different opening angles are not focused.

In the present embodiment, an electron microscope including a multi-trajectory focusing lens for astigmatism adjustment 61 for correcting the astigmatism and a stigma coil 71 will be described with reference to FIG. 19. In the electron microscope illustrated in FIG. 19, a lens 62 (opening angle adjusting lens: fifth lens) is provided in order to organically combine the optical system including the multi-trajectory focusing lens for astigmatism adjusting 61 (fourth lens) and the stigma coil 71 with the optical system exemplified in FIG. 1 and the like.

In the present embodiment, unlike the configuration in FIG. 1, the lens 62 for focusing a trajectory with different opening angles is arranged on P2 which is on the main surface of the divided beam focusing lens 14. The primary electrons 3a, 3b divided by the multi-lens array 13 are focused on a lens main surface P1 of the astigmatism adjusting multi-trajectory focusing lens 61. The focused beams are subjected to a lens action of the lens 61, and a central trajectory of the divided primary electrons 3a, 3b is focused on the optical axis at a point G1 where the astigmatism adjusting quadrupole 61 is provided (the central trajectory is deflected toward the point G1).

At the point G1, since the central trajectories 3a, 3b of the primary electrons divided by the multi-lens aperture 13 are focused on the optical axis (crossed with the optical axis), even if a magnetic field generated by the rotationally symmetric lens (lens 62) and an astigmatism correcting quadrupole field of the stigma coil 71 (astigmatism corrector) are superimposed at G1, the central trajectories (dotted lines in the drawing) do not change by the action of the lens and the quadrupole field.

On the other hand, the trajectories with different opening angles of the divided primary electrons 3a, 3b are off-axis. Therefore, by arranging (arranging such that G1 and the main surface of the lens 62 coincide) the stigma coil 71 that generates the quadrupole field for astigmatism correction at the point G1 and the lens 62 for adjusting the opening angles, it is possible to perform the astigmatism correction and focus adjustment equal to each of the divided beams.

Figure 19:
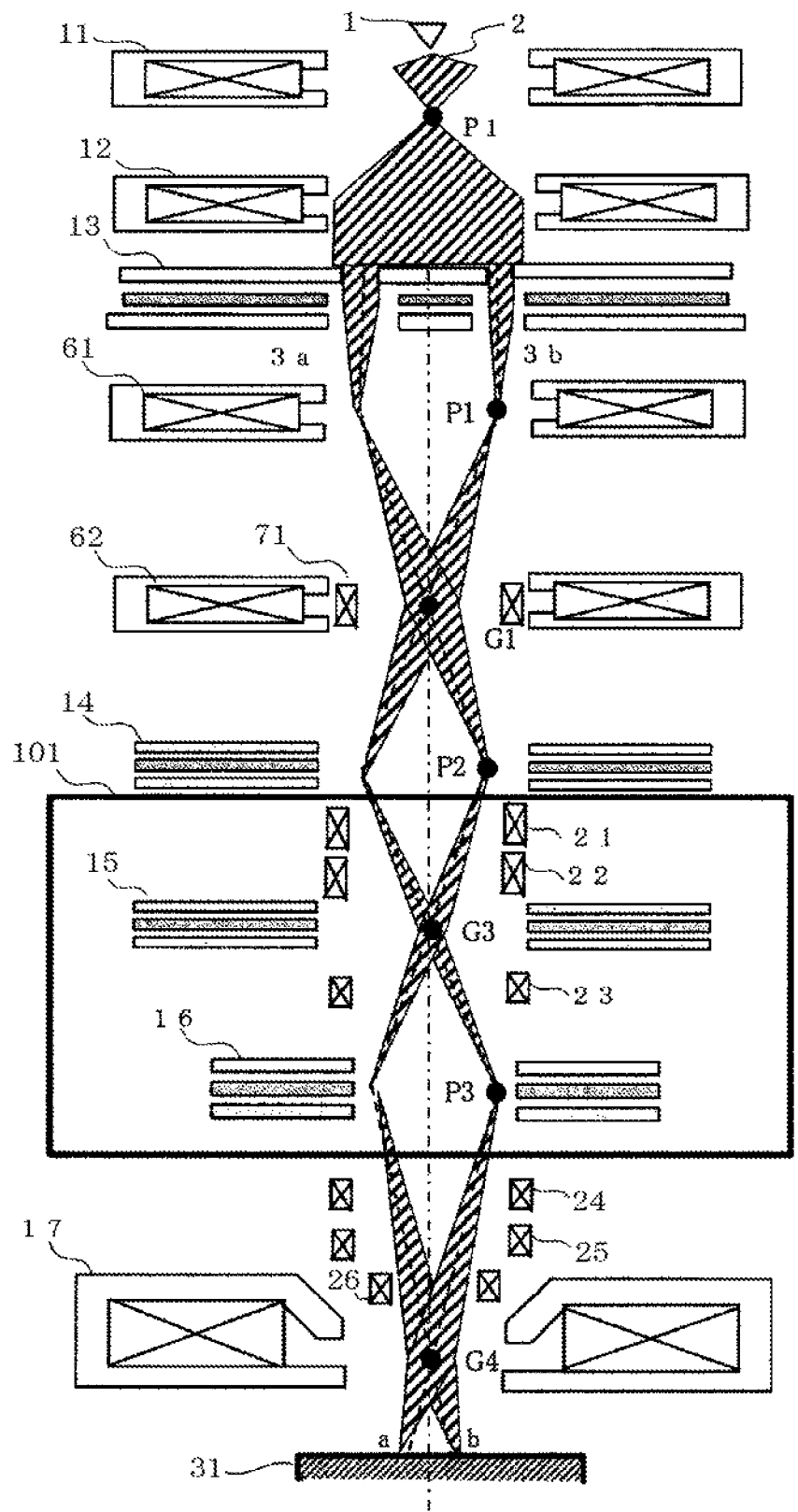
FIG. 19 is a diagram illustrating an example of a multi-beam irradiation device (a fifth embodiment and a sixth embodiment).

Incidentally, in the configuration in FIG. 19, as compared with the configuration of FIG. 1, although the position of P2 is different, the beams are focused on P2 by the opening angle adjusting lens 62 instead of the divided beam focusing lens 14 in FIG. 1. If the symmetrical and anti-symmetric relations described with reference to FIGS. 3 and 4 can be maintained, various modifications of the optical system are possible.

Sixth Embodiment

Further, when an accelerating voltage (landing energy) used for measurement or inspection is changed by adjusting a voltage (retarding voltage (negative voltage)) applied to a wafer, since optical magnification of the objective lens 17 changes depending on the accelerating voltage, an opening angle at points a, b on a sample of the primary electrons 3a, 3b landing on the sample changes.

As a sixth embodiment, an optical system enabling adjustment of the opening angle during acceleration change in the optical system shown in the fifth embodiment including a negative voltage applying power source to the sample is illustrated. It is possible to only change a position of the focusing point P without changing the central trajectories 3a, 3b by changing the intensity of the opening angle adjusting lens placed at a position where the central trajectories 3a, 3b of the divided primary electrons are focused. Therefore, by changing (adjusting) the lens intensity of the opening angle adjusting lens 62 when the objective lens condition is changed, it is possible to change the optical magnification and adjust the opening angle.

Since the appropriate landing energy and opening angle change according to the measurement purpose and the type of the measurement object pattern, by preliminarily tabulating a relationship between the objective lens condition when changing the landing energy and the opening angle adjusting lens and storing the relationship in a predetermined storage medium, it is possible to observe at an appropriate opening angle while maintaining the aberration correction condition regardless of the change in the landing energy. A control device set the lens conditions of each lens according to the change in the landing energy.

Seventh Embodiment

A case where divided primary electrons 3a, 3b are scanned using a scanning deflector 26 is considered. Because of the deflection action of the scanning deflector 26, the beams arrived at arrival points a, b are scanned over the sample. If a scanning range at this time is smaller than the distance between the points a, b, a gap is formed between scanning regions. Further, if the scanning range is larger than the distance of the gap b between the scanning regions, the scanning region can be overlapped.

Figure 20:
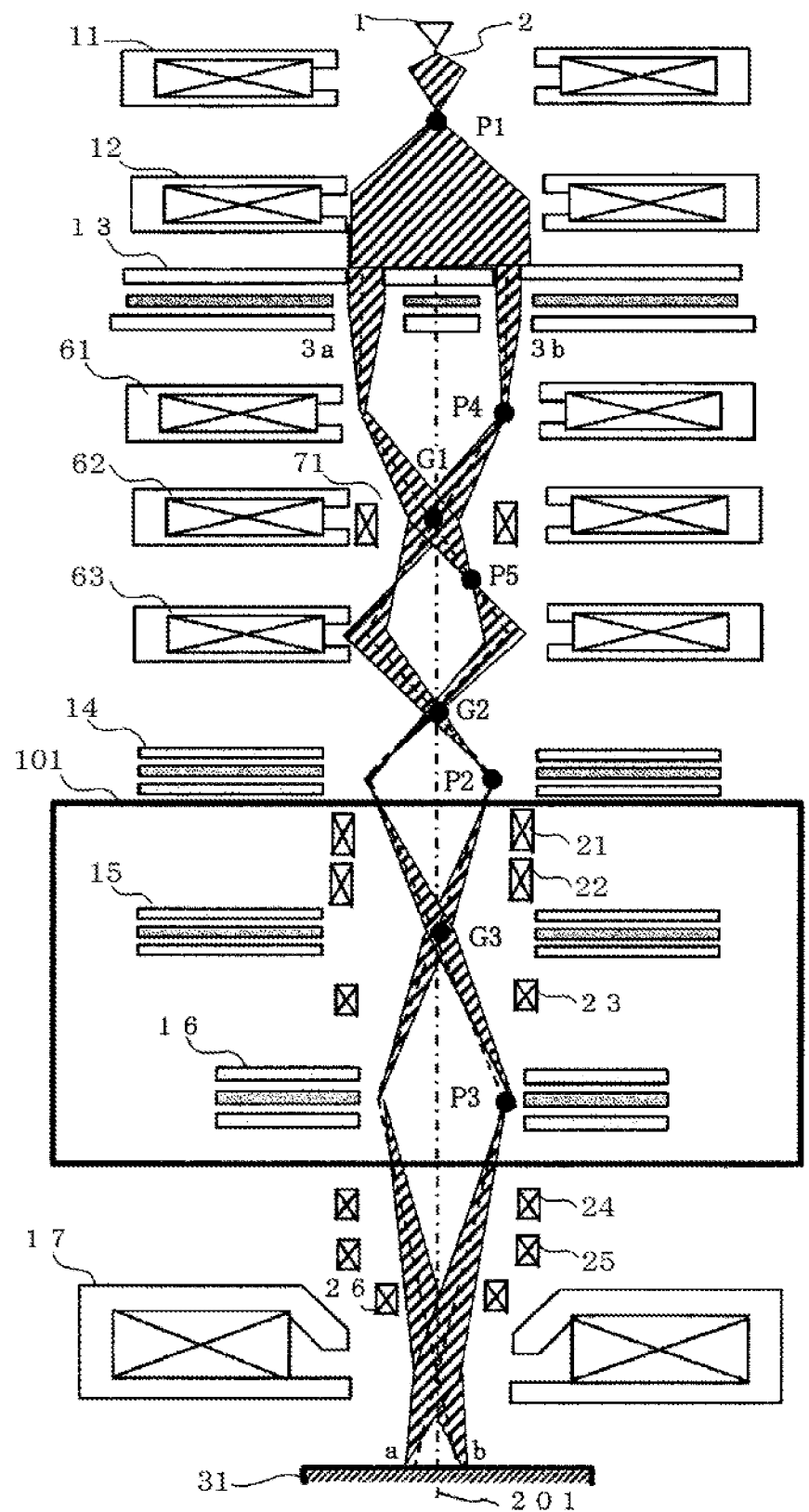
FIG. 20 is a diagram illustrating an example of a multi-beam irradiation device (a seventh embodiment).

In order to efficiently scan the sample, it is desirable to change the distance between the arrival points a, b in conjunction with the scanning range by the scanning deflector 26 by a control device that controls the optical element under a predetermined control condition. As a seventh embodiment, FIG. 20 illustrates an optical system where a multi-beam spacing adjusting lens 63 for changing e spacing between the arrival positions a, b of the primary electrons 3a, 3b divided by the aperture lens array 13 is mounted.

The primary electrons 3a, 3b divided by the multi-lens aperture 13 pass through the astigmatism adjusting multi-trajectory focusing lens 61 and the opening angle adjusting lens 62, and are then subjected to the lens action of the multi-beam spacing adjusting lens 63 and focused at the point P2. The distance between the arrival points a, b changes according to the distance between the divided beams 3a, 3b at the point P2. In other words, the distance between the divided beams 3a, 3b is projected onto the sample and becomes the distance between the arrival points a, b on the wafer.

For example, when the lens action of the multi-beam spacing adjusting lens 63 is strengthened (weakened), the focusing point G2 of the central trajectories of the divided primary electrons 3a, 3b rises (falls), and the distance between the divided primary electrons 3a, 3b at P2 decreases (increases). Since the optical magnification of the entire optical system changes when the lens intensity of the multi-beam spacing adjusting lens 63 is changed, the opening angle when the divided primary electrons 3a, 3b arrive at the wafer changes. Therefore, in order to suppress the change of the opening angle, the lens intensity of the opening angle adjusting lens 62 is changed synchronously with the change in the lens intensity of the multi-beam spacing adjusting lens 63.

For example, if scanning can be performed such that the scanning regions of a plurality of beams are not overlapped and there is no gap between the scanning regions, a high-resolution image of a wide region can be efficiently acquired. Therefore, in conjunction with the setting of the size (magnification) of the Field Of View (FOV), it is desirable to adjust the intensity of the multi-beam spacing adjusting lens 63 so as to satisfy such a condition.

In the opening angle adjusting lens 62 of the present embodiment, since the position of the lens main surface in the optical axis direction coincides with the point G1 (the point where the central trajectories of the divided primary electrons 3a, 3b are focused on the optical axis), the lens action for deflecting the central trajectories does not work. Therefore, it is possible to adjust the optical magnification without changing the spacing between the arrival points a, b on the wafer.

In the present embodiment, although the opening angle adjusting lens 62 is arranged at the point (for example, G1) where the divided primary electrons 3a, 3b are focused on the optical axis, even when the multi-beam spacing adjusting lens is arranged at the focusing point (for example, P5) of the trajectories with different opening angles, it is possible to independently control the central trajectories and the trajectories with opening angles, thereby simplifying the control.

Eighth Embodiment

Figure 21:
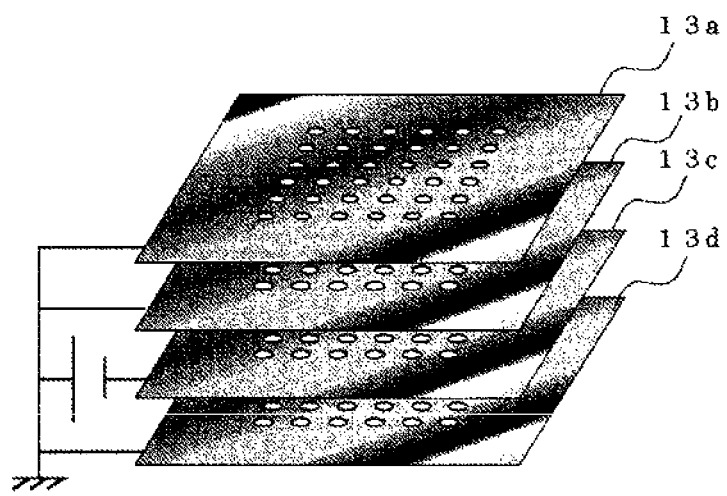
FIG. 21 is a structure explanatory view of an aperture lens array.
Figure 21:

FIG. 21 illustrates an example of an aperture lens array which divides a beam into a plurality of beams. The aperture lens array according to the present embodiment is formed of four electrodes 13a, 13b, 13c, and 13d. Primary electrons are incident from above the aperture lens array.

The primary electrons are formed in a circular shape in a multi-aperture array 13a arranged closest to an electron source side. After that, the primary electrons rush into a lens formed of three electrodes (13b, 13c, and 13d). In the present embodiment, a minus voltage is applied to the electrode 13c from a power source (not shown), and thus the lens is used as an einzel lens. When the primary electrons pass through the outside of the axis of the einzel lens, the primary electron beams passed by the influence of the aberration cannot be focused at one point, and a beam spot diameter when the beams arrive at the wafer 31 increases.

The aperture lens array according to the present embodiment makes a hole diameter of the aperture array 13 arranged in a front stage of the lens arrays (13b, 13c, and 13d) equal to or less than half of an electrode diameter (hole diameter of 13c or minimum diameter of hole diameter of 13b, 13c, and 13d) of the lens array, so that passage of the electrons passing through the outside of the axis of the lens formed by the lens array can be restricted.

Further, a lens array 13b connected to the ground is provided between the aperture array 13a and the lens array 13c to which a negative voltage is applied. In the absence of the present electrode, an electric field generated by applying a voltage to the electrode 13c leaks out from the aperture array 13a, acts on the electron beam before being restricted by the aperture array to generate aberration. As a result, the primary electron beams after passing through the aperture lens array become impossible to focus on one point due to the influence of the aberration, and the beam spot diameter on the wafer 31 increases.

By arranging the lens array 13b arranged on the ground between the aperture array 13a and the lens array 13c to which a negative or positive voltage is applied, the primary electrons rushing out of the axis of the lens generated by the multi-lens array (13b, 13c, and 13d) can be restricted. As a result, it is possible to focus the primary electrons after passing through the multi-lens array at one point.

Ninth Embodiment

In the optical system described above, in order to correct the off-axis aberration of the divided primary electrons and the deflection aberration generated by the beam deflection, cross positions (P1 to P5, G1 to G4) after passing through the aperture lens array 13 are fixed.

Therefore, in the optical system according to the present embodiment, a first condenser lens 11 (sixth lens) and a probe current adjusting lens 12 (seventh lens) are provided between the electron source 1 and the aperture lens array 13. Here, a specific example will be illustrated for the case of reducing a probe current amount of the divided primary electron beams 3a, 3b.

Primary electrons emitted from the electron source 1 are focused at the point P1 under the lens action of the first condenser lens. Then, the primary electrons are converted into beams parallel to the optical axis 201 by an incident angle control lens 12 and the aperture lens array 13 is irradiated with the primary electrons, and the primary electrons are formed into circular-shaped beams.

The beam current after molding is determined by the hole diameter of the aperture lens array 13 and the current density of the primary electrons with which the aperture lens array 13 is irradiated. Therefore, by increasing the intensity of the first condenser lens to move the point P1 upward and increasing a focal length by decreasing the lens intensity of the probe current adjusting lens 12, the density of the primary electrons with which the aperture lens array is irradiated can be reduced while maintaining the irradiation angle (parallel to the optical axis in the present embodiment). As a result, it is possible to reduce the probe current of the divided primary electrons 3a, 3b with which the wafer is irradiated.

REFERENCE SIGN LIST 1 electron source
2 primary electron (electron beam)
3a central trajectory of divided primary electron
3b central trajectory of divided primary electron
11 first condenser lens
12 probe current adjusting lens
13 aperture lens array
14 divided beam focusing lens
15 aberration generating lens
16 color dispersion trajectory focusing lens
17 objective lens
18 diaphragm
19 rotationally symmetric lens for focusing assistance
21 deflector
22 deflector
23 deflector
24 deflector
25 deflector
26 scanning deflector
30 Wien filter
31 wafer
41 electromagnetic dipole
42 electromagnetic quadrupole
51 electromagnetic pole forming Wien filter
52 electromagnetic pole forming Wien filter
53 electromagnetic pole forming Wien filter
54 electromagnetic pole forming Wien filter
61 astigmatism adjusting multi-trajectory focusing lens
62 opening angle adjusting lens
63 multi-beam spacing adjusting lens
71 stigma coil
101 deflection aberration corrector
201 optical axis
301 primary electron passing through Wien filter
a divided beam arrival point on wafer
b divided beam arrival point on wafer
P1 crossover
P2 crossover
P3 crossover
P4 focal point of lens
P5 front focal point of objective lens
G1 crossover of central trajectories of divided beams
G2 crossover of central trajectories of divided beams
G3 crossover of central trajectories of divided beams

The invention claimed is:

1. A beam irradiation device comprising:
a beam source configured to emit a plurality of beams;
an objective lens configured to focus a beam on a sample;
a first lens arranged such that a lens main surface is positioned at an object point of the objective lens and configured to deflect a plurality of incident beams toward an intersection point of a main surface of the objective lens and an optical axis;
a second lens arranged closer to a beam source side than the first lens and configured to focus the plurality of beams on a main surface of the first lens; and
a third lens arranged closer to the beam source side than the second lens and configured to deflect the plurality of beams toward an intersection point of a main surface of the second lens and the optical axis.

2. The beam irradiation device according to claim 1, wherein the second lens is a Wien filter.

3. The beam irradiation device according to claim 2, further comprising:
an auxiliary lens configured to assist a focusing action of the Wien filter on at least one of a side closer to the beam source side and a side closer to a sample side than the Wien filter.

4. The beam irradiation device according to claim 1, wherein the third lens is an electromagnetic dipole or an electromagnetic quadrupole.

5. The beam irradiation device according to claim 1, further comprising:
a fourth lens arranged closer to the beam source side than the third lens and configured to deflect the plurality of beams toward the optical axis;
an astigmatism corrector configured to correct astigmatism at a position where the optical axis intersects the plurality of beams deflected by the fourth lens; and
a fifth lens including a lens main surface at the intersecting position and configured to focus the plurality of beams on a lens main surface of the third lens.

6. The beam irradiation device according to claim 5, wherein the fifth lens is adjusted according to a negative voltage applying power source which applies a negative voltage to the sample and a change in the negative voltage of the negative voltage applying power source applied to the sample.

7. The beam irradiation device according to claim 1, further comprising:
a scanning deflector configured to scan the plurality of beams;
a spacing adjusting lens configured to adjust a distance between the plurality of beams; and
a control device configured to control the spacing adjusting lens,
wherein the control device controls the spacing adjusting lens according to a scanning width by means of the scanning deflector.

8. The beam irradiation device according to claim 1, wherein the beam source configured to emit the plurality of beams includes
a chip configured to emit an electron;

an aperture lens array formed of a plurality of electrodes having a plurality of openings configured to divide a beam emitted from the chip into a plurality of beams; and a power supply configured to apply a voltage to at least one of the plurality of electrodes.

9. The beam irradiation device according to claim 8, wherein a radius of the opening of the electrode disposed nearest to a chip side among the plurality of electrodes is not more than half of a radius of the opening of other electrodes.

10. The beam irradiation device according to claim 8, wherein the aperture lens array includes at least two electrodes which are grounded to a ground and closer to the chip side than the electrode to which the voltage is applied.

11. The beam irradiation device according to claim 8, further comprising:

a sixth lens configured to focus the beam emitted from the chip; and a seventh lens configured to further focus the beam passing through the sixth lens between the chip and the aperture lens array, wherein an intensity of the seventh lens is weakened as a focusing point of the sixth lens approaches the chip.

* * * * *